(12) United States Patent
Mizutani

(10) Patent No.: US 6,304,319 B1
(45) Date of Patent: Oct. 16, 2001

(54) EXPOSURE APPARATUS, METHOD OF PRODUCING THE SAME, AND METHOD OF PRODUCING DEVICES

(75) Inventor: Hideo Mizutani, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/454,866

(22) Filed: Dec. 7, 1999

Related U.S. Application Data

(63) Continuation of application No. PCT/JP98/02535, filed on Jun. 9, 1998.

(30) Foreign Application Priority Data

Jun. 9, 1997 (JP) ...................................................... 9-164926

(51) Int. Cl.$^7$ ............................ G03B 27/42; G03B 27/72; G03B 27/32
(52) U.S. Cl. ................................... 355/69; 355/53; 355/77
(58) Field of Search .................................. 355/53, 55, 60, 355/67–71, 77; 356/399–401; 250/548, 492.2

(56) References Cited

U.S. PATENT DOCUMENTS

| | | | |
|---|---|---|---|
| 4,052,603 | 10/1977 | Karlson | 364/120 |
| 5,150,173 * | 9/1992 | Isobe et al. | 356/401 |
| 5,286,963 * | 2/1994 | Torigoe | 250/201.2 |
| 5,424,552 * | 6/1995 | Tsuji et al. | 250/548 |
| 5,689,339 * | 11/1997 | Ota et al. | 356/401 |
| 6,100,987 * | 8/2000 | Kawakubo | 356/401 |

FOREIGN PATENT DOCUMENTS

A-5-190422   7/1993   (JP) .

* cited by examiner

Primary Examiner—David M. Gray
Assistant Examiner—Hung Henry Nguyen
(74) Attorney, Agent, or Firm—Oliff & Berridge, PLC

(57) ABSTRACT

The present invention relates to a technology for detecting at higher accuracy the position of a photosensitive substrate coated with photoresist with the use of a simpler arrangement. According to the present invention, the photoresist coating on the surface of the photosensitive substrate on which alignment marks are applied is a specific photoresist which is transparent to exposure light so that the alignment marks on the photosensitive substrate can be read with detection light which has a wavelength equal or approximate to the wavelength of the exposure light and may be lower in the intensity than a desired level of the exposure light required for exposure action. Accordingly, the present invention eliminates a conventional process for preparing legibility of the alignment marks on a photosensitive substrate such as exposing coating of the photoresist on the substrate to light for giving transparency to the detection light or removing a portion of the photoresist which covers the alignment marks.

27 Claims, 5 Drawing Sheets

EXPOSURE APPARATUS, METHOD OF PRODUCING THE SAME, AND METHOD OF PRODUCING DEVICES

RELATED APPLICATIONS

This is a Continuation of PCT/JP98/02535 filed Jun. 9, 1998. The entire disclosure of the prior application is hereby incorporated by reference herein in its entirety.

BACKGROUND OF THE INVENTION

1. Field of the Invention

The present invention relates to an exposure apparatus for transferring a specific patter of image from a mask to a photosensitive substrate, a method of producing the exposure apparatus, and a method of producing device with the exposure apparatus, and particularly, to a technology for detecting the position of the photosensitive substrate while monitoring alignment mark on the mask and alignment mark on the photosensitive substrate.

2. Related Background Art

It is common, in an exposure apparatus applied for performing a lithography process in manufacturing semiconductor devices, liquid crystal devices, and other relevant devices, to monitor alignment marks on the mask and the photosensitive substrate with an alignment microscope viewing from above the mask for positioning the mask and photosensitive substrate (for example, a wafer or a glass coated with photosensitive material such as photoresist). Some of techniques for detecting the position of a photosensitive substrate are a TTL (through the lens) alignment method (laser step alignment or LSA) using non-exposure light and projection optics as disclosed in Japanese Patent Laid-open Publication (Sho)60-130742 (U.S. Pat. No. 4,677,301), an off-axis alignment method (field image alignment or FIA) using a wide band of non-exposure light as disclosed in Japanese Patent Laid-open Publication (Sho) 62-171125, and a TTR (through the reticle) alignment method (auto step alignment or ASA) using exposure light through reticle.

SUMMARY OF THE INVENTION

We, the inventors, have found through reviewing the prior art methods that the following problems are not solved. Among the prior art method described above, the TTL alignment using non-exposure light enables to prevent the photoresist from being exposed to light and has an advantage that the detection of alignment mark on a substrate is facilitated because the photoresist has a higher transparency to non-exposure light. On contrary, this method is susceptible to aberration of non-exposure light in the optical projecting system. In general, the optical projecting system has only a narrow range of aberration compensation and thus requires an extra optics for the compensation which may complicate the overall arrangement. In addition, it is necessary to employ illumination light approximate to monochrome light having a narrow range of wavelengths as the non-exposure light for ease of the compensation, whereby the effect of resist interference will be inevitable.

In the off-axis alignment using a wide band of non-exposure light, alignment mark on a substrate is monitored with the light having a wide band for minimizing the effect of resist interference. However, an extra optics for monitoring the alignment mark is needed in addition to the optical projection system. If the relative relationship between the two optical systems is unstable, the accuracy of the detection of the position will be declined thus lowering the throughput.

The TTL alignment method and the off-axis alignment method require extra optics in addition to the optical projecting system. It is hence needed to prepare reference markings such as fiducial points for measuring offset values between respective optical systems, whereby the apparatus will be made intricate.

In the TTR alignment used when directly monitoring the alignment mark on a substrate through a reticle is needed while exposure light is applied, aberration in the optical projecting system is negligible because the exposure light is involved. However, this method employs a novolak organic material as the photoresist for the photosensitive substrate. The photoresist of such a material has a lower transparency to the exposure light before exposure, causing detection light from the alignment mark to be received at a less S/N ratio (signal noise ratio). Also, the photoresist of such a material possibly produces bleaching which increases the transparency during the exposure and a phenomenon that the refraction is gradually changed, hence causing distortion of an image of the alignment mark and increasing error in the detection of the position. For compensation, some modifications have been proposed; for example, a preparatory irradiation of the exposure light is applied before the main exposure action to increase the transparency of the photoresist (to expose a portion which covers the alignment mark and make the photoresist transparent to a degree) for making a stable state that change in the refraction does not occur or a portion which covers the alignment mark is removed to expose the alignment mark as disclosed in U.S. Pat. No. 5,656,229. This step will delay the detection of the position of the substrate thus lowering the throughput. Also, in case that the removal of the portion is carried out by etching, the protection of the alignment mark is needed as will be troublesome.

The present invention has been invented for eliminating the foregoing problems and its object is to provide an exposure apparatus having a simple arrangement capable of detecting the position of a substrate at higher accuracy without applying a preparatory irradiation over or removing a portion of the photoresist which covers alignment mark on the photoresist substrate, a method of producing the exposure apparatus, and a method of producing devices with the exposure apparatus.

A method of producing devices according to the present invention comprises: a first step of placing at a specific location a photosensitive substrate having a surface thereof provided with alignment marks and coated with a photoresist which is substantially transparent to detection light having a wavelength falling within a range where the wavelength of exposure light exists; a second step of detecting the position of the alignment marks with the detection light of the wavelength and adjusting the position of the photosensitive substrate in response to result of the detection; and a third step of illuminating a mask having a pattern of interest with the exposure light and transferring the pattern of interest via an optical projecting system to the photosensitive substrate. The wavelength of the detection light is within a range where the wavelength of the exposure light exists ($\lambda \pm 100$ nm when $\lambda$ being the wavelength of the exposure light).

The photosensitive substrate prepared at the first step may be a substrate having the alignment marks applied to the surface thereof and coated with the photoresist. The photoresist may be a transparent photoresist which is transparent to the exposure light and the detection light. The transparent photoresist may have a transparency of higher than 10% for one micrometer of thickness to the exposure light and the detection light and preferably may be of chemical magnification type.

In the method of producing devices according to the present invention, the second step is arranged for directing the detection light to the alignment marks on the photosensitive substrate while its amount is being controlled to be smaller than a desired level of the exposure light. The desired level of the exposure light may be an level enough to cause the transparent photoresist to respond to the exposure light. The amount of the detecting light may preferably be less than 1/3 the desired level of the exposure light for protecting the alignment marks. More preferably for avoiding the optical properties of the transparent photoresist from being affected, the amount of the detection light may be smaller than a threshold at which the transparent photoresist becomes susceptible to the detection light.

We, the inventors, made sure that when the surface of the substrate was protected with anti-reflection coating (BARC), the alignment marks could significantly be read with a level of the detection light which is substantially 10% of the desired level of the exposure light. Also, we, the inventors, made sure that when the substrate was not provided with anti-reflection coating, the detection light which is as small as 2% to 3% of the desired level of the exposure light was sufficient to read the alignment marks.

As described above, in the method of producing devices according to the present invention, the second step may directly follow the first step without performing a preparatory step of making the alignment marks on the photosensitive substrate legible for monitoring. The preparatory step includes illuminating with the exposure light a portion of the photoresist which covers the alignment marks on the photosensitive substrate to make the photoresist transparent (for preparatory exposure) or removing the portion of the photoresist to expose the alignment marks. Accordingly, the present invention allows the alignment marks to be monitored without performing such a preparatory step or the photoresist covering the alignment marks to be protected from being excessively exposed to the exposure light so that the alignment can be carried out at higher accuracy before transferring a pattern of interest on the mask to the photosensitive substrate.

An exposure apparatus for implementing the method of producing device according to the present invention is provided comprising: a first stage for moving a photosensitive substrate which is being placed thereon; a second stage for moving a mask which is provided with a pattern of interest and being placed thereon; an optical illuminating system for illuminating the mask with exposure light; an optical projecting system for transferring the pattern of interest on the mask to the photosensitive substrate; an alignment system including a detection light supplying device for emitting detection light which is adapted for detecting the position of the photosensitive substrate (and has a wavelength equal or approximate to the wavelength of the exposure); and a illumination controller for controlling an accumulated amount of the detection light.

The accumulated amount of the detection light or the exposure light is a product of the intensity (light density) and the duration for illumination. Accordingly, the illumination controller may thus control directly the accumulated amount of the detection light irradiated on the photosensitive substrate while monitoring at least either the intensity of the detection light or the duration for illumination. It may be possible that when the detection light is pulsed, the accumulated amount of the detection light is controlled by counting the number of pulses.

The exposure apparatus of the present invention allows the position of the substrate to be detected at higher accuracy without performing preparatory exposure of light to a portion of the photoresist covering the alignment marks on the photosensitive substrate or removing the portion preliminarily prior to projecting a pattern on the photosensitive substrate.

A method of producing the exposure apparatus above described is also provided comprising at least: a first step of preparing a first stage for moving a photosensitive substrate which is being placed thereon; a second step of preparing a second stage for moving a mask which is provided with a pattern of interest and being placed thereon; a third step of preparing an optical illuminating system for illuminating the mask with exposure light; a fourth step of preparing an optical projecting system for transferring the pattern of interest on the mask to the photosensitive substrate; a step of preparing an alignment system including a detection light supplying device for emitting detection light which is adapted for detecting the position of the photosensitive substrate (and has a wavelength equal or approximate to the wavelength of the exposure); and a step of preparing a illumination controller for controlling an accumulated amount of the detection light.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Embodiments of the present invention will be described referring to FIGS. 1 to 6. Like components are denoted by like numerals throughout the drawings for simplification of the description.

Figure 1:
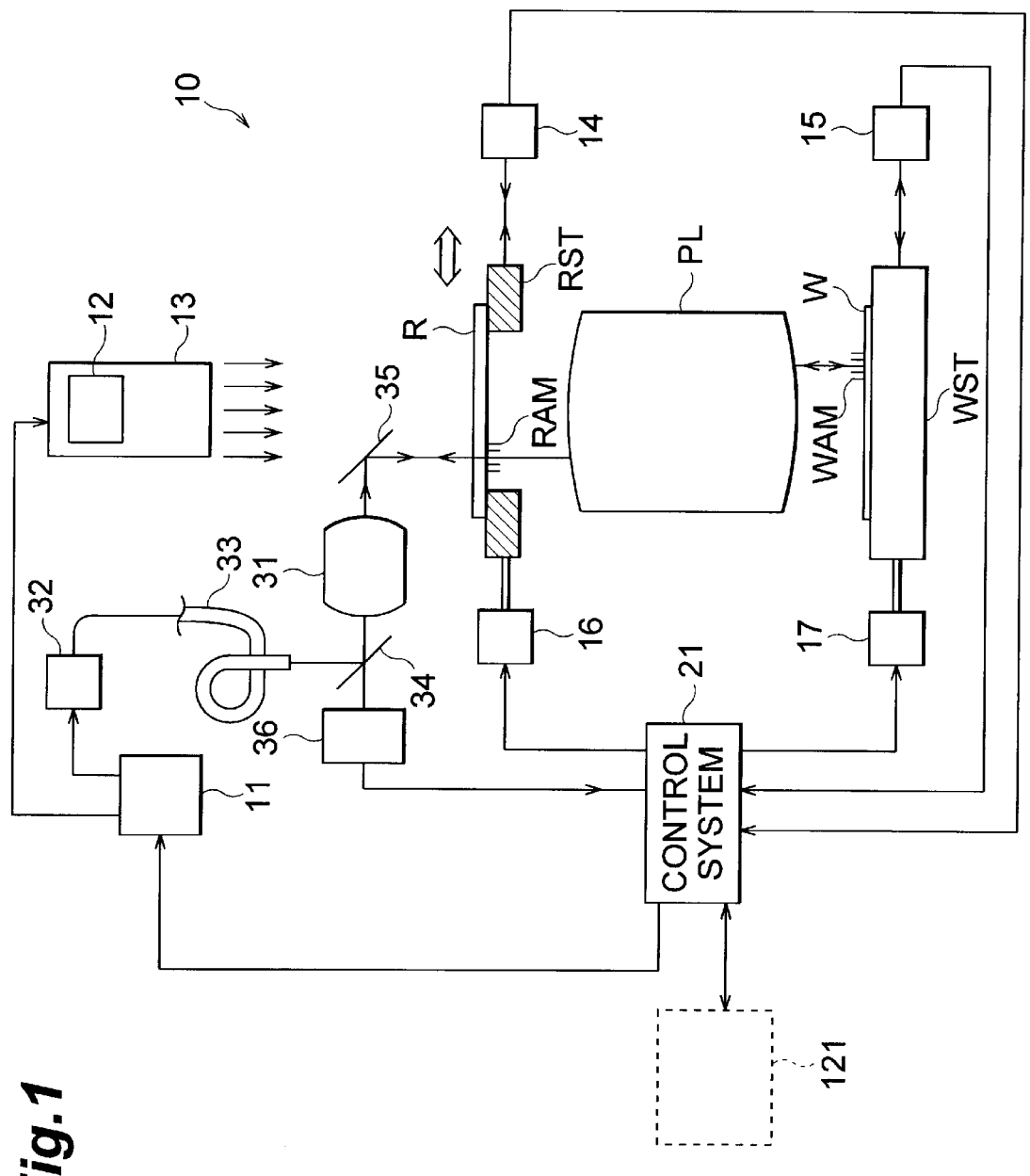
FIG. 1 is a view showing a schematic arrangement of an exposure apparatus according to the present invention (which implements a method of producing devices according to the present invention)

FIG. 1 is a view showing a schematic arrangement of an exposure apparatus of the present invention (which implements a method of producing devices according to the present invention). The exposure apparatus is a so-called lens scan type exposure apparatus. The direction of scanning is parallel to the paper surface of the drawing as leftward or rightward.

As shown in FIG. 1, a mask or a reticle R is placed on a reticle stage RST. A wafer W which is a photosensitive substrate is placed on a wafer stage WST. An optical projecting system PL for transferring a pattern of interest (a reticle pattern) applied on the reticle R to the wafer W is disposed between the reticle stage RST and the wafer stage WST. The reticle R and the wafer W are located conjugate with each other about the optical projecting system PL.

Provided on the reverse side of the optical projecting system PL to the reticle R are an illumination optics 13 and an illumination source 12.

A reticle stage interference system 14 is provided adjacent to the reticle stage RST for measuring the position of the reticle stage RST while a wafer stage interference system 15 is provided adjacent to the wafer stage WST for measuring the position of the wafer stage WST.

On the other hand, the position of the reticle stage RST is controlled to a desired position by a reticle stage driving mechanism 16 while the position of the wafer stage WST is controlled to a desired location by a wafer stage driving mechanism 17.

Figure 2:
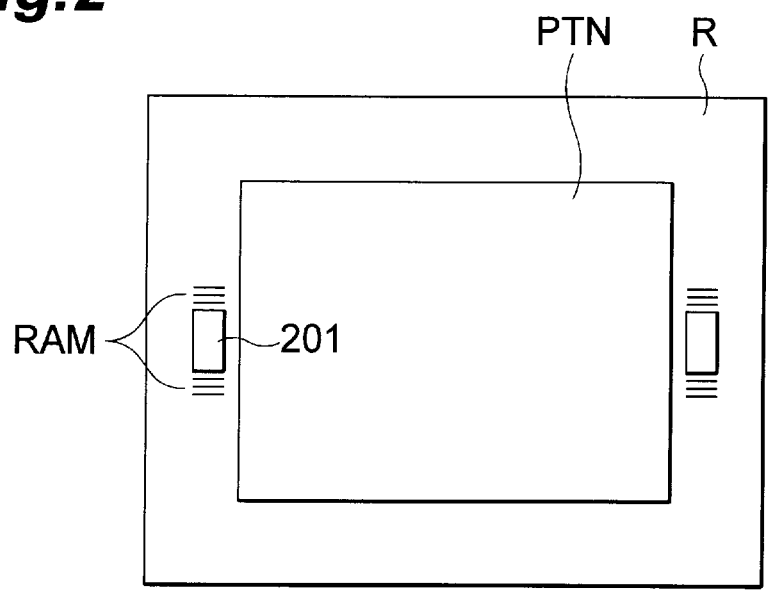
FIG. 2 is a plane view showing a reticle (mask) used with the method of producing devices according to the present invention.

The exposure apparatus 10 also includes a control system 21 for receiving measurement signals from the reticle stage interference system 14 and the wafer stage interference system 15 and controlling the reticle stage driving mechanism 16 and the wafer stage driving mechanism FIG. 2 is a plane view showing an example of the reticle (mask) used with the method of producing devices according to the present invention. As shown in FIG. 2, the reticle R has externally a four-sided shape where a four-sided pattern region PTN is provided. A rectangular window 201 for passing light and a pair of alignment marks RAM of stripe pattern located on both sides of the window 201 are provided at one side of an frame configuration defined between two corresponding sides of the reticle R and the pattern region PTN. The lengthwise direction of stripes of the alignment mark RAM extends in parallel with the shorter side of the window 201.

Another window 201 and another pair of alignment marks RAM are formed at the other side of the frame configuration beside the pattern region PTN. A set of alignment marks similar in pattern to the reticle alignment marks RAM (hence referred to wafer alignment marks WAM) is formed on the wafer W.

The reticle R and the wafer W are located so that when the reticle R is placed on the reticle stage RST, the wafer alignment marks WAM are located at a position on the wafer which is conjugate with about the window 201 and the optical projecting system PL.

A deflecting mirror 35 is mounted between the reticle stage RST and the illumination optics 13 for deflecting an external beam of light (alignment light) to the window 201 and the reticle alignment marks RAM. Reflections of the light via the window 201 from the wafer alignment marks WAM and from the reticle alignment marks RAM are then deflected by the deflecting mirror 35 and run in one direction along which there are provided an alignment optics 31, a beam splitter 34, and an imaging element 36 such as CCD in this order. A detection signal produced by the imaging element 36 is transmitted to a control system 21.

The alignment optics 31 acts as an alignment illumination optical system for illuminating the light for alignment to the wafer alignment marks WAM and the reticle alignment marks RAM and an alignment detection optical system for collecting and receiving reflections of the light from the wafer alignment marks WAM and the reticle alignment marks RAM.

The beam splitter 34 is arranged to receive light from the output end of an optical fiber 33. The input end of the optical fiber 33 is connected to alignment optics 31. The input end of the optical fiber 33 may be connected to the illumination light source 12 for receiving a portion of the illumination light and directing it to the reticle R.

As a light for alignment (detection light) to be directed to the wafer alignment marks WAM and the reticle alignment marks RAM, a wavelength equal to or close to the wavelength of the exposure wavelength (exposure light) is used. Accordingly, when the input end of the optical fiber 33 is connected to the alignment optics 31, a beam of light of which the wavelength is equal to or close to that of the exposure light is emitted as the alignment light to the wafer alignment marks WAM and the reticle alignment marks RAM In case that the input end of the optical fiber 33 is connected to the illumination light source 12, a portion of the illumination light having an exposure wavelength is emitted as the alignment light to the wafer alignment marks WAM and the reticle alignment marks RAM.

More specifically, the alignment light (detection light) of which the wavelength falls in a range including the exposure wavelength, i.e. the wavelength is equal to or close to the wavelength (exposure wavelength) of the exposure light, is defined by a wavelength of $\lambda e \pm 100$ nm where $\lambda e$ (nm) is the exposure wavelength. The optical projecting system PL is preferably compensated so that its chromatic aberration is within $\lambda e \pm 100$ nm. More preferably, the wavelength of the alignment light is $\lambda e \pm 50$ nm in view of facilitating compensation of the chromatic aberration in the optical projecting system PL. Still more preferably, the wavelength of the alignment light is $\lambda e \pm 30$ nm for ease of the compensation of the chromatic aberration and simplification of the overall arrangement of the optical projecting system PL. When the wavelength of the alignment light is identical to the exposure wavelength (i.e. the alignment light is the exposure light), no compensation of the chromatic aberration in the optical projecting system PL is needed and the overall arrangement of the optical projecting system PL will thus be simplified. In view of contributing to the simplification of the overall arrangement of the optical projecting system, the wavelength of the alignment light is preferably equal to the exposure wavelength rather than close to that.

The exposure apparatus 10 shown in FIG. 1 is now explained with the alignment light source 32 emitting alignment light of the exposure wavelength like as the illumination light source 12 for emitting the exposure light.

The illumination light source 12 and the alignment light source 32 are electrically connected to an illumination controller 11 which controls energy density or amount of light per unit area of the illumination light from the illumination light source 12 and the alignment light source 32 to a desired rate.

In case that the input end of the optical fiber 33 is connected to the illumination light source 12, the illumination controller 11 for electrically controlling the alignment light source 32 for illumination may be replaced by a plurality of light attenuating filters (ND filters) which are different to each other in the transmissivity and disposed between the illumination light source 12 and the input end of the optical fiber 33 or between the output end of the optical fiber 33 and the beam splitter 34 as serving as a replaceable illumination controller.

Figure 3:
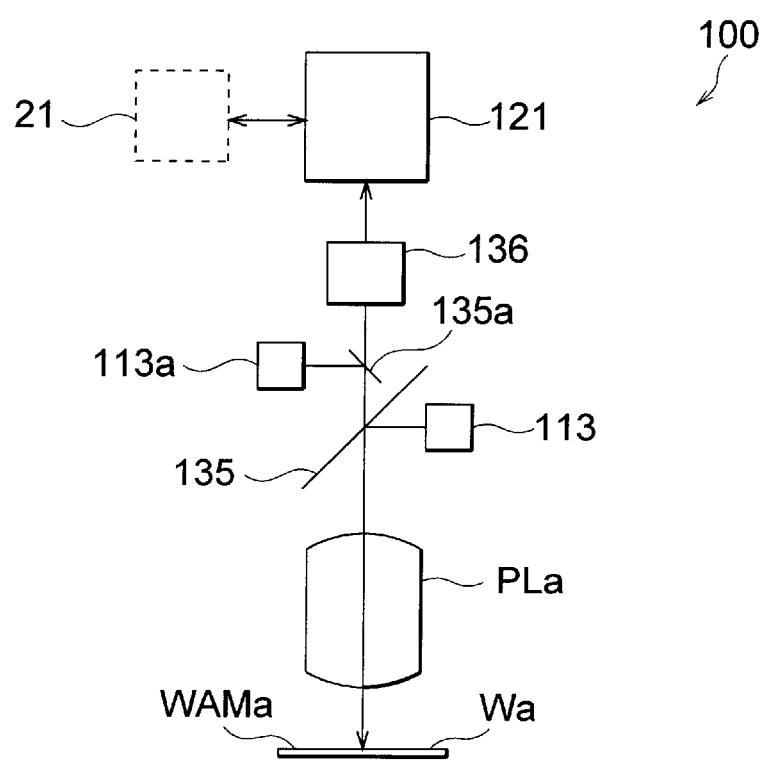
FIG. 3 is a view showing a schematic arrangement of a deviation detecting system.

On the other hand, adjacent to the optical projecting system, a deviation detecting system 100 as shown in FIG. 3 is arranged.

As shown in FIG. 3, an objective optics PLa in the deviation detecting system 100 is achromatic and aberration compensated over the exposure wavelength and a wide band. Also, the imaging requirements including NA, wavelength, and σ value in the illumination are set substantially equal to those of the optical projecting system PL.

An imaging element 136 is arranged conjugate with a substrate Wa about the objective optics PLa. Two half mirrors 135 and 135a are disposed in this order between the objective optics PLa and the imaging element 136. Provided along a deflection of the optical axis of the objective optics PLa deflected by the half mirror 135 is an illumination system 113 for illumination at the exposure wavelength and along a deflection of the optical axis deflected by the half mirror 135a is an illumination system 113a for illumination at the wide band. A detection signal produced by the imaging element 136 is transmitted to a detector system 121.

The detector system 121 is electrically connected to the control system 21 in the exposure apparatus 10. As will be described later in more detail, the signal about deviation from the detector system 121 is fed to the control system 21 of the exposure apparatus 10.

This optics or the deviation detecting system 100 shown in FIG. 3 allows wafer alignment marks WAMa applied on the wafer Wa to be coaxially illuminated from above via the half mirrors 135 and 135a by the exposure wavelength of the illumination system 113 and the wide band of the illumination system 113a.

The action of the projection exposure apparatus 10 will be described referring to FIG. 1. As the reticle R is uniformly illuminated via the illumination optics 13 by the exposure (excimer) light, an actual pattern in the region PTN of the reticle R is projected and focused on the wafer W by the optical projecting system PL.

The position of the reticle stage RST is precisely measured by the reticle stage interference optics 14. Similarly, the position of the wafer stage WAT is precisely measured by the wafer stage interference optics 15. For exposure of the reticle pattern, the reticle R and the wafer W are moved in synchronism on the reticle stage RST and the wafer stage WST respectively. The synchronous movements of the reticle stage RST and the wafer stage WST are controlled by the control system 21 driving the reticle stage driving mechanism 16 and the wafer stage driving mechanism 17 in response to signals from the reticle stage RST and the wafer stage WST respectively. The movements of the two stages RST and WST are carried out linearly along the z direction identical to the optical axis of the optical projecting system PL and the X and Y directions on a surface orthogonal to the z direction, and rotated along a θ direction on the XY surface about the z axis.

Detecting the reticle alignment marks RAM and the wafer alignment marks WAM is conducted from above the reticle R by the alignment optics 31 via the deflecting mirror 35. More specifically, the detection uses a beam (alignment light) which is directly led via the optical fiber 33 from the alignment light source 32 or is a portion of the exposure light from the illumination light source 12.

The beam led from the optical fiber 33 and reflected by the beam splitter 34 runs through the alignment optics 31 and the deflecting mirror 35 and illuminates the reticle alignment marks RAM and also after passing the windows 201, falls on the wafer alignment marks WAM via the optical projecting system PL.

As shown in FIG. 2, the reticle alignment marks RAM and the windows 201 for detecting the wafer alignment marks WAM on the wafer W are formed on the reticle R. Reflections of light from the reticle alignment marks RAM and the wafer alignment marks WAM are deflected by the deflecting mirror 35, passed through the alignment optics 31 and the beam splitter 34, and focused on the imaging element 36 of which the signals are processed as position detection measurements for the wafer W in the control system 21.

Although the detection of the alignment marks is carried out with commonly bright-field illumination, dark-field illumination which eliminates regular reflection of light may be used. Particularly, when positive and negative first-order diffracted lights from the alignment marks of grating pattern are selectively picked up from incident light having a small σ value and focused on the CCD camera 36, its image is increased in the contrast at sine-wave. This may successfully be applied to smaller step alignment marks. The detection at higher accuracy will be guaranteed by selectively using the bright-field and dark-field illumination depending on the configuration of the alignment marks.

Figure 4:
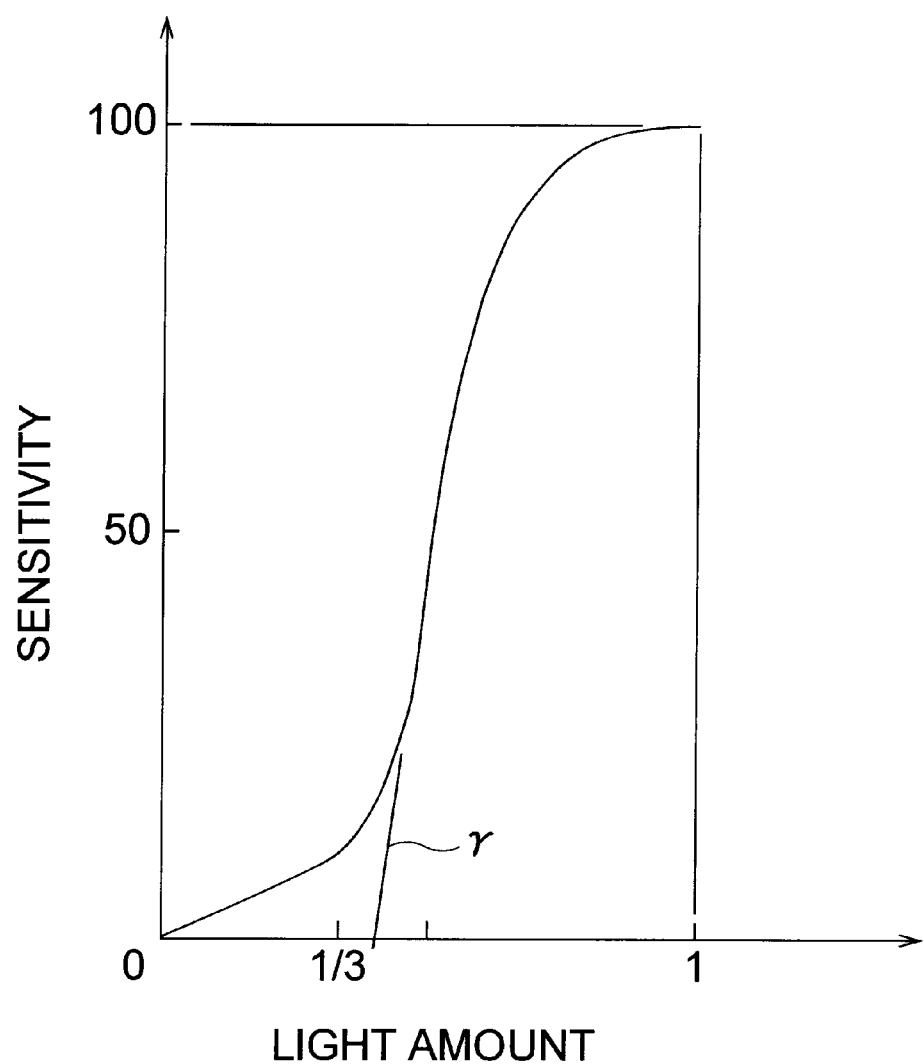
FIG. 4 is a graphic diagram showing the relationship between the amount of exposure light and the photosensitivity of a transparent photoresist used in the method of producing devices according to the present invention.

FIG. 4 illustrates a graphic diagram showing the relationship between the amount of illumination and the sensitivity of photoresist. The horizontal axis represents the amount of illumination and the vertical axis represents the sensitivity of a photoresist applied to the substrate where denoted by 100 is a desired sensitivity for exposing to illumination of the actual pattern. When the sensitivity is 100, the amount of illumination for exposure is a desired level. The amount of illumination along the horizontal axis is a density of energy or light energy per unit area (for example, measured in $J/cm^2$) and hereby denoted in no particular unit where the desired level is 1.

As shown in FIG. 4, the sensitivity moderately rises up to a particular level and thereafter sharply soars to approximately the maximum level corresponding to the desired exposure. The sharply soaring curve is a γ value.

Returning to the description of the action of the projection exposure apparatus shown in FIG. 1, the detection light is preferably as small as possible in view of protecting the wafer alignment marks WAM on the wafer W. However, because the photoresist is high in the γ value, it can bear about ⅓ the desired exposure amount to resist against the etching and protect the alignment marks and although it may be thinned less significantly after the development. This level is expressed by a product of the intensity of illumination and the duration of exposure. Accordingly, even if the intensity of illumination is high, the illumination for a shorter duration permits monitoring. When the intensity of illumination is low, the monitoring under exposure will be extended in time. The illumination controller 11 is thus adapted to control either the intensity of the detection light (alignment light) or the duration of illumination. When the detection light is pulsed, controlling the number of pulses can determine an accumulated amount of the detection light.

According to the present invention, the amount of the alignment light is set to a level which is greater than the minimum required for detecting the alignment marks and remains under a level at which the resist coated over the alignment marks becomes susceptible to the alignment light. As described above, the level may be determined relative to the desired exposure amount required for producing a projection of the actual pattern.

While the illumination controller 11 determines the amount of the alignment light, it also controls so that the ratio of the exposure per unit area on the wafer W with the illumination optics 13 to the exposure per unit area on the wafer W with alignment optics 31.

Also, if the wafer is protected with an anti-reflection coating, its reflected light becomes lower. In that case, the detector (imaging element) 36 has to be increased in the sensitivity or higher than the desired exposure amount of light has to be applied. In the latter, it is inevitable to degrade the wafer alignment marks WAM. If the wafer alignment marks WAM are degraded through the etching process, they have to be reformed.

However, it is true that the process using anti-reflection coating is rare and the frequency for reforming the alignment marks is rather low. Therefore, this drawback will not be serious. Increasing the sensitivity of the imaging element such as CCD may be achieved by attenuating the dark current through cooling down the device or taking reverse actions (MMP actions).

In the exposure apparatus of scan type, the illumination of light is pulsed and using one single pulse for the detection can permit the alignment during scanning exposure. For example, KrF excimer laser has a pulse width of substantially 10 ns and displacement of its emission at the scanning speed of 100 mm/s is as small as 1 nm on the wafer which will hence be negligible in the projection.

When the exposure light of the exposure wavelength is used as the alignment light for monitoring the alignment marks, it may read error of marking non-symmetry from non-uniformity of the resist coating because of its monochromatic property. While the smoothness of the wafer surface has been improved by chemical mechanical polishing (CMP) with the help of uniform coating of the resist to minimize the error, a technique of compensating the deviation of the exposure light (light having the exposure wavelength) from the predetermined wide band with the deviation detecting system 100 can also eliminate unwanted effects of thin-film interference and thus increase the accuracy of the position detection. More specifically, when the alignment marks to be read via TTR by the alignment light having the exposure wavelength have preliminarily been read by a second wavelength of the light (of the wide band), deviation from reading with the exposure wavelength of the light is calculated under the same conditions (of $\lambda$, $\sigma$-value, and NA).

The deviation detecting system 100 is now explained in more detail. The deviation detecting system 100 shown in FIG. 3 includes the illumination system 113 for illumination at the exposure wavelength and the illumination system 113a for illumination at the wide band and is actuated where two beams of the illumination from the two light sources are deflected by the half mirrors 135 and 135a respectively and directed via the objective optics PLa to the wafer Wa coaxially of the optical axis of the optics PLa for illumination from above.

Reflections of the two beams reflected by the wafer alignment marks WAM on the wafer Wa are passed through the objective optics PLa and the half mirrors 135 and 135a to the imaging element 136. Accordingly, two optical images of the wafer alignment marks WAM by the two reflected beams are developed and received by the imaging element 136. Their detection signals produced by the imaging element 136 are transmitted to the detecting system 121 where the deviation of the exposure wavelength from the wide band is precisely calculated.

The detecting system 121 then delivers signals of the deviation to the control system 21 of the exposure apparatus 10 shown in FIG. 1. The control system 21 of the exposure apparatus 10 modifies the alignment measurements received from the detector 36 of the alignment system with the deviation signals of the detecting system 121 regarded as compensating factors. As a result, unwanted effects of the thin-film interference or the like on the resist are eliminated and the detection of the position of the wafer alignment marks WAM can be increased in the accuracy. Accordingly, positional difference between the wafer alignment marks WAM and the reticle alignment marks RAM can be detected at higher accuracy.

Preferably, while the deviation is measured at all the alignment marks WAM on the wafer W, it is used for compensating the alignment of the same marks detected through the optical projecting system PL. However, it is also possible to measure some typical ones of the alignment marks with the deviation detecting system 100 and determine an average of their measurements for use as a compensating factor to modify the alignment measurements of the detector 36 of the alignment system in the exposure apparatus 10. Moreover, the deviation detecting system 100 may be provided separately of the exposure apparatus 10. This permits the deviation of the alignment marks to be measured at once while the exposure apparatus 10 is driven for exposure of the preceding wafer W to a pattern of light, hence avoiding declination of the throughput. In that case, the deviation of each alignment mark is recorded and used for compensating the alignment measurement of the detector 36 of the alignment system 31 in the exposure apparatus 10 when the exposure apparatus 10 is driven for exposure.

While the deviation detecting system 100 shown in FIG. 3 is arranged coaxially, achromatic action may hardly be made with difference between the exposure wavelength and the second wavelength being greater, for example, between laser light ($\lambda$=193 nm) from ArF laser source and 500 to 800 nm wavelength light. However, the deviation detecting system is easily modified by having two detecting blocks for the two difference wavelengths respectively and calibrating the stability of the two detecting blocks with the use of reference marking, not shown, provided on the wafer stage WST. Since every ArF laser source ($\lambda$=193 nm) is hardly aligned except for the use of TTR alignment method, the method of the present invention is significantly effective.

Although the second wavelength of a wide band is used for measuring the deviation in the prescribed embodiment, the deviation may be measured by a non-optical position detecting means such as atomic force microscope.

The photoresist employed in the present invention is now explained. Generally, chemical magnification type photoresist contains as a base polymer polyvinyl phenol which has a low absorptivity of ultraviolet light and thus preferably used with a KrF excimer laser ($\lambda$=248 nm). This type of photoresist is higher in the transparency to exposure light than commonly used anti-melting type resist of which the base polymer is novolak resin and which is suited with gray ($\lambda$=436 nm) or i ray ($\lambda$=365 nm). The thickness of resist is practically 0.3 to 0.7 $\mu$m. The detection light hence travels forward and backward across the resist a total of 0.6 to 1.4 $\mu$m. When the resist is 1 $\mu$m in the thickness, the transparency to a wavelength of the monitoring light requires 10% higher and preferably 50% or 80% higher.

The chemical magnification type resist or the like employed for the present invention is preferably but not limited to a higher transparency to only the exposure light and may be high in the transparency to other wavelengths near the exposure wavelength. Such preferable transparent photoresists (of chemical magnification type) include "TDUR-P009" and "TDUR-N908" of TOKYO OHKA KOGYO Co., Ltd., "KRFK2F" and "KRF3J" of JSR Co., Ltd., and "APEX-E2405" and "SNR200-0.7" of SHIPLEY company.

Accordingly, the photoresist which is transparent to the exposure wavelength or wavelengths close to the exposure wavelength, i.e. it has an optical transparency to the exposure light and the alignment light, is employed in the present invention as described above.

The transparent photoresist is also remarkably lower in the transparency variation and the refraction variation at the exposure than known novolak photoresist. Accordingly, while a wafer coated with the transparent photoresist is monitored with the exposure light, the detection signal will hardly be attenuated and the alignment marks will significantly be prevented from being distorted by bleaching or refraction change. Moreover, the detection with the use of a smaller intensity of illumination is enabled when the detector is a CCD or the like, hence allowing minimum exposure to the photoresist over the alignment marks. As a result, the alignment marks can be protected from degradation.

In the prior art, it is requested to use a smaller intensity of the detection light for protecting the alignment marks. On the contrary, it is preferred to use a higher intensity of the detection light which causes some resists to turn to transparent or the alignment marks to be read across a lower transparent resist, thus making a dilemma. The inventors of the present invention also made sure that even when a substrate was coated with an anti-reflection coating (BARC), its alignment marks were read with substantially 10% of the desired level of the exposure light as the detection light. Furthermore, the inventors made sure that with no anti-reflection coating, the alignment marks on a substrate was satisfactorily read with 2% to 3% of the desired level of the exposure light.

Figure 5:
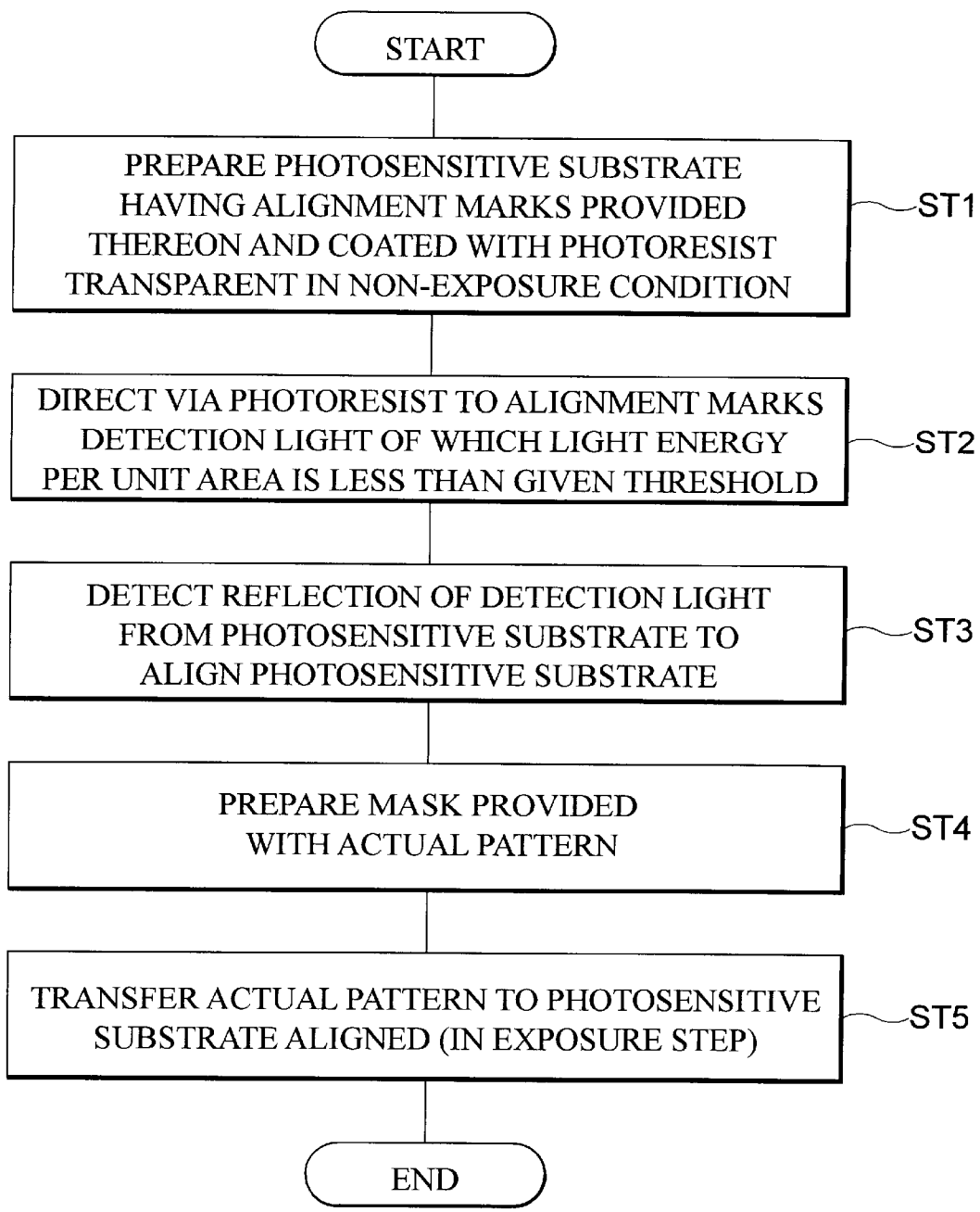
FIG. 5 is a flowchart explaining the method of producing devices according to the present invention.

The method of producing device according to the present invention will be described referring to the flowchart of FIG. 5.

First at Step ST1, a photosensitive substrate coated with a photoresist such as chemical magnification type photoresist which is transparent in non-exposure condition is provided on which a group of alignment marks are applied.

Figure 6:
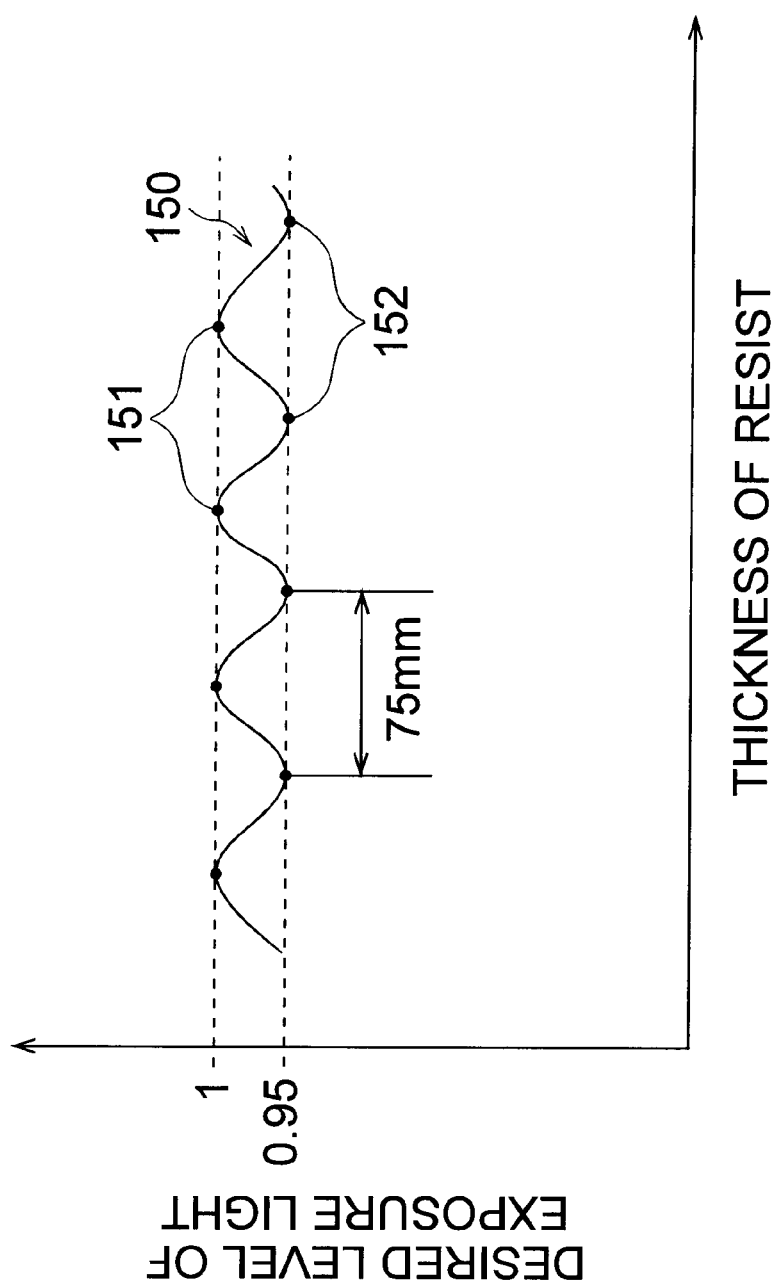
FIG. 6 is a graphic diagram illustrating the relationship between the photoresist and the desired exposure amount of exposure light.

The relationship between the thickness of the photoresist and a desired level of the exposure (or line width) is as shown in the graphic diagram of FIG. 6. The profile in the graph is called a swing curve. Periodic changes in the desire level are caused by interference between reflected light on the resist surface and reflected light on the substrate surface. When the photoresist has, for example, a refraction rate N of 1.65 to the exposure light having 248 nm of a wavelength, a peak 151 and a bottom 152 of the swing curve 150 appear at equal intervals of 75 nm.

In particular, as the resist thickness is set to the peak 151 of the swing curve 150, the intensity of reflected light from the photosensitive substrate increases in equivalent and thus the alignment light to be received increases enabling the position to be detected at higher accuracy. This is particularly advantageous when the position of a substrate provided with anti-reflection coating is detected. However, since the exposure to projection of the actual pattern requires a higher intensity of incident light and in view of improving the throughput, the thickness of the resist may preferably be set to the bottom 152.

At the peak 151 or the bottom 152 of the swing curve 150, the intensity of the reflected light from the photosensitive substrate is less susceptible to change in the resist thickness (because the gradient adjacent to the peak or bottom on the swing curve 150 is small). More particularly, the waveform of the alignment light received for alignment mark detection is hardly deformed, hence making the detection of alignment marks stable with the use of monochromatic illumination.

Because of the above reason, the thickness of the photoresist according to the present invention is set to the peak 151 or the bottom 152 of the swing curve 150 shown in FIG. 6.

Step ST2 then follows where the alignment marks are exposed via a transparent photoresist covering the alignment marks to alignment light which (has a wavelength equal or approximate to the exposure wavelength and) is smaller than a threshold of light energy per unit area of the exposure light irradiated on the photosensitive substrate, more precisely for example, less than $\frac{1}{3}$ the desired level of the exposure light needed for exposure of the substrate.

At Step ST3, reflections of the alignment light of Step ST2 reflected from the photosensitive substrate are detected. In response to result of the detection, alignment of the photosensitive substrate is carried out.

After the alignment of the photosensitive substrate is completed, an original (reticle) having an actual pattern (e.g. a circuit pattern) applied thereon is placed at its position (Step ST4). Step ST4 may be implemented before or after or in parallel to any of the preceding steps ST1 to ST3.

Then Step ST5 follows where the actual pattern (reticle) is illuminated by the exposure light of the exposure wavelength and its optical image is projected by an optical projecting system PL on the photosensitive substrate aligned properly for exposure.

By performing the above steps, the position of the substrate is detected using the alignment light having a wavelength equal or approximate to the wavelength of the exposure light while no conventional pre-exposure nor physical action is needed for removing a portion of the resist which covers the alignment marks on the photosensitive substrate.

Accordingly, the method of producing devices according to the present invention can successfully be applied to manufacture quality semiconductor devices (including LSIs, imaging elements such as CCD, thin-film magnetic heads, and liquid crystal displays).

As set forth above, the present invention permits the position of a substrate to be aligned at higher accuracy since the alignment marks on the substrate can be detected without exposing a transparent photoresist to illumination of light from an optical projecting system.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An exposure method, comprising:
   a first step of placing at a specific location a photosensitive substrate having a surface thereof provided with alignment marks and coated with a photoresist;
   a second step of detecting a position of the alignment marks with the use of a detection beam which has a wavelength equal or approximate to the wavelength of exposure light and adjusting the position of the photosensitive substrate in response to a result of the detection; and a third step of exposing a predetermined pattern onto the photosensitive substrate with the exposure light of the exposure wavelength;

said second step arranged for directing the detection beam to the alignment marks on the photosensitive substrate while an amount of the detection beam is being relatively controlled to a predetermined level at which the resist coated over the alignment marks becomes susceptible to light which has a wavelength equal or approximate to the wavelength of the exposure light.

2. An exposure method according to claim 1, wherein the predetermined level allows the second step to directly follow the first step without performing a step of making the alignment marks on the photosensitive substrate legible for monitoring.

3. An exposure method according to claim 1, wherein the photoresist has a transparency of higher than 10% for one $\mu$m of thickness to the exposure light and the detection beam.

4. An exposure method according to claim 3, wherein the photoresist includes chemical magnification type photoresist.

5. An exposure method according to claim 1, wherein the wavelength of the detection beam includes a wavelength falling in a given range where the wavelength of the exposure light exists.

6. An exposure method according to claim 1, wherein the wavelength of the detection beam is within a range of $\lambda \pm 100$ nm where $\lambda$ being the wavelength of the exposure light.

7. An exposure method according to claim 1, wherein the amount of the detection beam is controlled to less than 1/3 the desired level of the exposure light.

8. An exposure method according to claim 1, wherein the predetermined level is at least approximately equal to a threshold at which the photoresist becomes susceptible to the detection beam.

9. An exposure method according to claim 1, wherein the detection beam is monochromatic light having the wavelength of the exposure light, and further comprising:

obtaining a first data about the position of the alignment marks from a first detecting action with the detection beam;

obtaining a second data about the position of the alignment marks from a second detecting action which is different from the first detecting action;

calculating a deviation between resultant measurement determined by the first detecting action and resultant measurement determined by the second detecting action on the basis of the first data and the second data; and compensating the resultant measurement of the first detecting action in response to the deviation.

10. An exposure apparatus according to claim 8, wherein the second detecting action includes a process for detecting the position of the alignment marks with the use of a wide-band beam which has a band of wavelength different from the wavelength of the exposure light.

11. A method of manufacturing device using an exposure method defined in claim 1.

12. An exposure method according to claim 1, wherein the predetermined level at which the resist coated over the alignment marks becomes susceptible to light which has a wavelength equal or approximate to the wavelength of the exposure light corresponds to an amount of light sufficient to bring a steep increase in a sensitivity of the resist.

13. A method of exposing a predetermined pattern onto a substrate with a monochromic beam having a specific wavelength, comprising:

directing a monochromic detection beam to alignment marks provided on a substrate and performing a first detecting action for detecting light from the alignment marks to obtain a first data about the position of the alignment marks;

performing a second detecting action including detecting the position of the alignment marks with a wide-band detection beam;

calculating a deviation between resultant measurement determined by the first detecting action and resultant measurement determined by the second detecting action on the basis of the first data and the second data; and exposing the predetermined pattern onto the substrate which is aligned according to the resultant measurement of the first detecting action compensated with the deviation.

14. An exposure method according to claim 13, wherein the second detecting action includes a process of detecting the position of the alignment marks by a nonoptical system such as an atomic force microscope.

15. A method of manufacturing devices including a process of exposing a substrate using an exposure method defined in claim 13.

16. A method of producing devices including exposing a substrate using the exposure method defined in claim 14, wherein the predetermined pattern is provided on a mask, the method further comprising:

directing the exposure light to the mask to transfer an optical image of the predetermined pattern via a projecting system to the substrate.

17. An exposure apparatus that exposes a predetermined pattern onto a photosensitive substrate coated with photoresist, the exposure apparatus comprising:

an alignment system including a detection beam supplying device that supplies a detection beam which has a wavelength equal or approximate to the wavelength of exposure light and is adapted for detecting the position of the photosensitive substrate; and an illumination controller, which is electrically connected to the detection beam supplying device, and which controls an amount of the detection beam irradiated on the photosensitive substrate according to a predetermined level at which the resist coated over the substrate becomes susceptible to light which has a wavelength equal or approximate to the wavelength of the exposure light.

18. An exposure apparatus according to claim 17, wherein the illumination controller controls the amount of the detection beam to less than 1/3 the desired level of the exposure light.

19. An exposure apparatus according to claim 17, wherein the photoresist is substantially transparent to the detection beam.

20. An exposure apparatus according to claim 18, wherein the photoresist has a transparency of higher than 10% for one $\mu$m of thickness to the exposure light and the detection beam.

21. An exposure apparatus according to claim 17, wherein the alignment system includes:

a first device that performs a first detecting action using the detection beam to obtain a first data about the position of the alignment marks;

a second device that performs a second detecting action different from the first detecting action to obtain a second data about the position of the alignment marks;

a third device, which is electrically connected to the first device and the second device, and which calculates a deviation between resultant measurement determined by the first detecting action and resultant measurement determined by the second detecting action on the basis of the first data and the second data; and a fourth device, which is electrically connected to the third device, and which compensates the resultant measurement of the first detecting action with the deviation.

22. An exposure apparatus according to claim 17, wherein the wavelength of the detection beam includes a wavelength falling within a range where the wavelength of the exposure light exists.

23. An exposure apparatus according to claim 22, wherein the wavelength of the detection beam is within a range of $\lambda \pm 100$ nm where $\lambda$ being the wavelength of the exposure light.

24. A device manufactured by exposing the predetermined pattern onto the photosensitive substrate with an exposure beam having an exposure wavelength with the exposure apparatus defined in claim 17.

25. A device according to claim 24, wherein the predetermined pattern is provided on a mask, the device further comprising:

directing the exposure light to the mask to transfer an optical image of the predetermined pattern via a projecting system to the photosensitive substrate.

26. An exposure apparatus according to claim 17, wherein the predetermined level at which the resist coated over the substrate becomes susceptible to light which has a wavelength equal or approximate to the wavelength of the exposure light corresponds to an amount of light sufficient to bring a steep increase in a sensitivity of the resist.

27. A method of manufacturing an exposure apparatus for exposing a predetermined pattern onto a photosensitive substrate coated with photoresist, the method comprising:

a first step of providing an alignment system including a detection beam supplying device for supplying a detection beam which has a wavelength equal or approximate to the wavelength of exposure light and is adapted for detecting the position of the photosensitive substrate; and a second step of providing an illumination controller for controlling an accumulated amount of the detection beam irradiated on the photosensitive substrate according to a predetermined level at which the resist coated over the substrate becomes susceptible to light which has a wavelength equal or approximate to the wavelength of the exposure light.

* * * * *